(12) United States Patent
Stone

(10) Patent No.: US 7,014,488 B2
(45) Date of Patent: Mar. 21, 2006

(54) SOCKET COVER WITH RECESSED CENTER AND METHOD

(75) Inventor: Brent S. Stone, Chandler, AZ (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 10/901,703

(22) Filed: Jul. 29, 2004

(65) Prior Publication Data

US 2006/0024982 A1 Feb. 2, 2006

(51) Int. Cl.
*H01R 13/62* (2006.01)
(52) U.S. Cl. .................. 439/331; 439/135; 439/73
(58) Field of Classification Search ............. 439/331, 439/73, 67, 135, 940, 487
See application file for complete search history.

(56) References Cited

U.S. PATENT DOCUMENTS

| 4,351,580 A | * | 9/1982 | Kirkman et al. ............... 439/71 |
| 4,692,790 A | * | 9/1987 | Oyamada .................... 257/727 |
| 6,116,949 A | * | 9/2000 | Costello et al. ............. 439/509 |
| 6,413,111 B1 | | 7/2002 | Pickles et al. |
| 6,547,609 B1 | | 4/2003 | Howell et al. |
| 6,648,656 B1 | * | 11/2003 | Ma ............................. 439/73 |
| 6,753,474 B1 | | 6/2004 | Trout |
| 6,805,563 B1 | * | 10/2004 | Ohashi ......................... 439/73 |
| 6,890,202 B1 | * | 5/2005 | Yasufuku et al. ........... 439/331 |
| 6,899,553 B1 | * | 5/2005 | Ma et al. .................... 439/135 |

* cited by examiner

*Primary Examiner*—Hien Vu
(74) *Attorney, Agent, or Firm*—Schwabe, Williamson & Wyatt, P.C.

(57) ABSTRACT

A socket cover with a recessed center, method for using such a socket cover and system using such a socket cover are described herein.

11 Claims, 5 Drawing Sheets

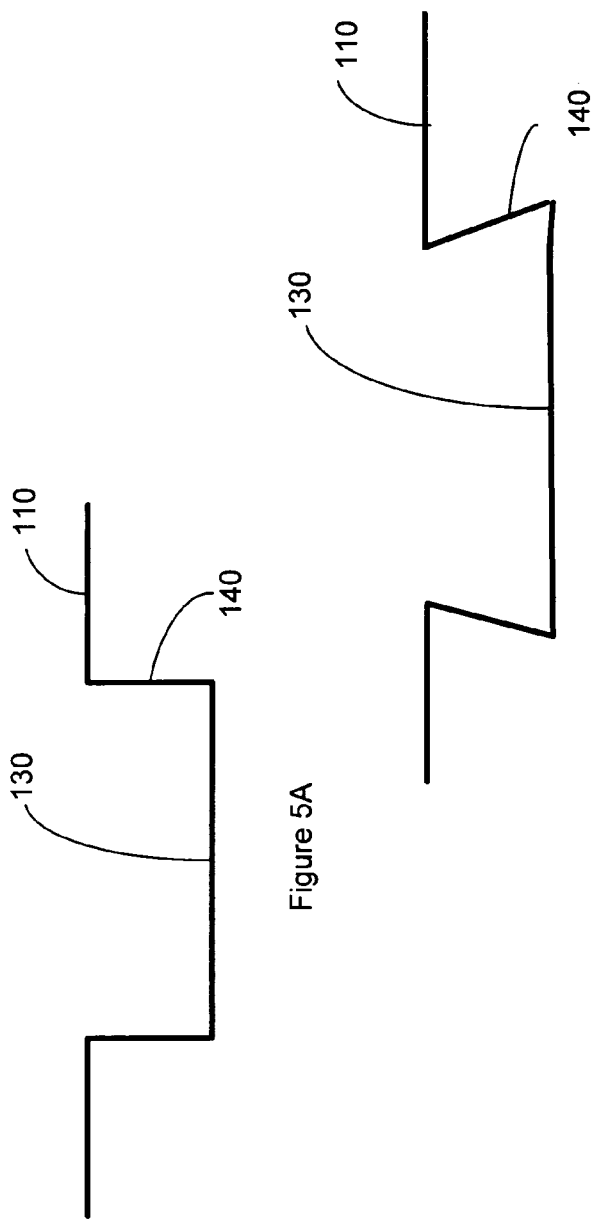
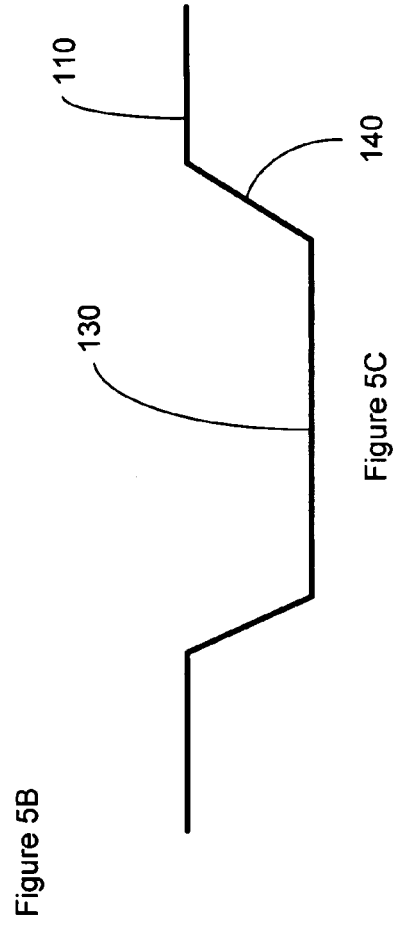

SOCKET COVER WITH RECESSED CENTER AND METHOD

TECHNICAL FIELD & BACKGROUND

Embodiments of the present invention are related to the field of integrated circuit packaging.

Current substrate components with a high thermal mass, for example a circuit board with a surface mount Land Grid Array (LGA) Socket, may require significant air flow over the surface of the components during a reflow process in a forced air convection oven to reduce the temperature differential between the outer edges and the center of the components. With a lower temperature gradient between the outer edges of the component and the center of the component, the reflow process for the high thermal mass may be enhanced. Also the thermal mass of the LGA socket with integrated direct socket loading fixture may be much higher than previous sockets.

Additionally, with the current pick and place cover designs, it is possible for a package to be engaged in the socket with the pick and place cover attached to the socket. This may lead to accidental assembly of the LGA socket onto a motherboard while a package is installed in the LGA socket, thereby damaging the package.

BRIEF DESCRIPTION OF THE DRAWINGS

The present invention will be described by way of exemplary embodiments, but not limitations, illustrated in the accompanying drawings in which like references denote similar elements, and in which:

FIGS. 5A to 5C illustrate side views of different angular orientations of sidewalls of the socket cover of FIG. 1 in accordance with various embodiments.

DETAILED DESCRIPTION OF ILLUSTRATIVE EMBODIMENTS

Figure 1:
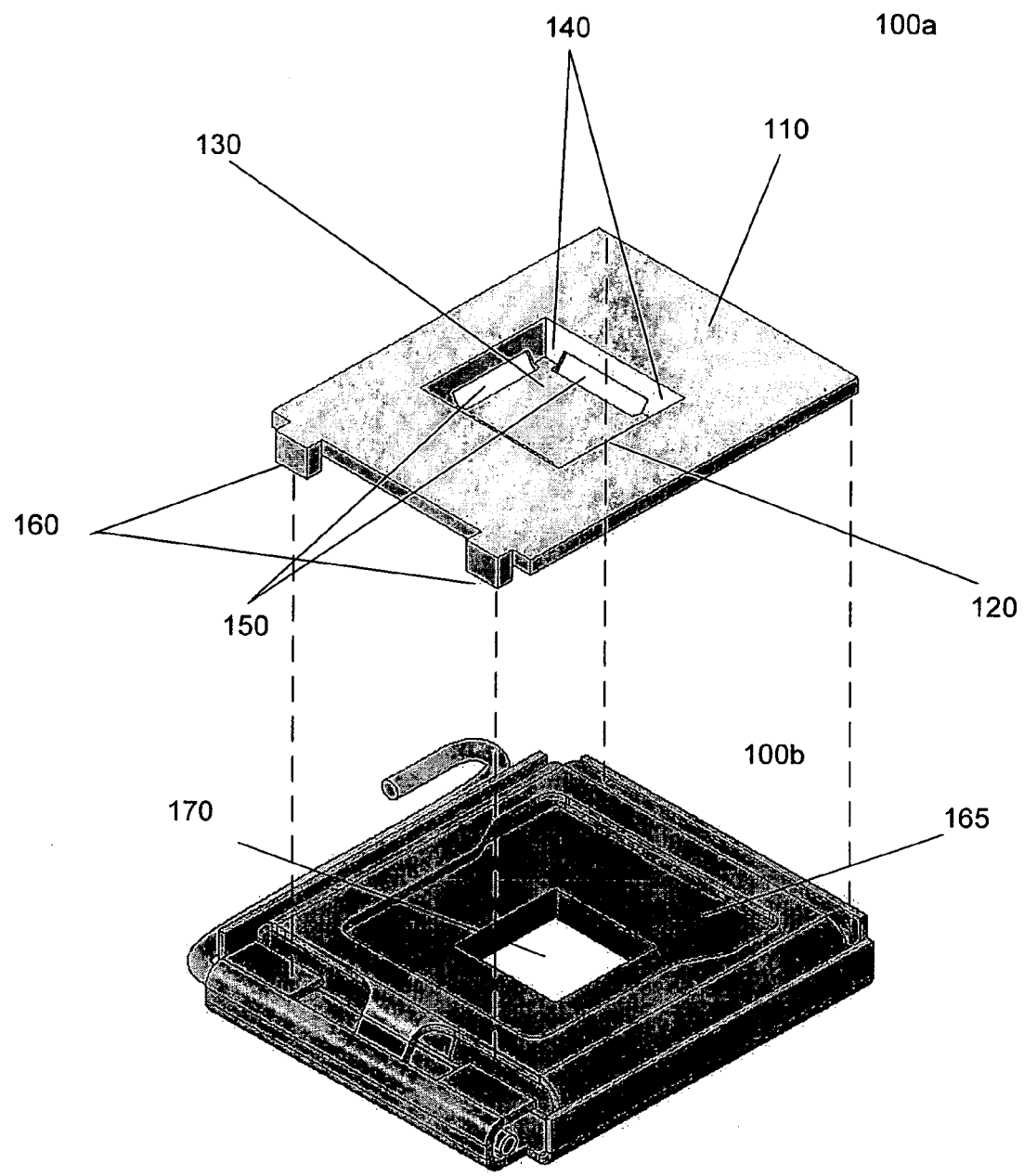
FIG. 1 illustrates an exploded view of a socket package including a socket cover, in accordance with one embodiment.

Embodiments of the present invention include, but are not limited to a socket cover with a recessed center, a method for using the socket cover, and a system adapted to use the socket cover.

Various aspects of the illustrative embodiments will be described using terms commonly employed by those skilled in the art to convey the substance of their work to others skilled in the art. However, it will be apparent to those skilled in the art that the present invention may be practiced with only some of the described aspects. For purposes of explanation, specific numbers, materials and configurations are set forth in order to provide a thorough understanding of the illustrative embodiments. However, it will be apparent to one skilled in the art that the present invention may be practiced without the specific details. In other instances, well-known features are omitted or simplified in order not to obscure the illustrative embodiments.

Various operations will be described as multiple discrete operations, in turn, in a manner that is most helpful in understanding the present invention. However, the order of description should not be construed as to imply that these operations are necessarily order dependent. In particular, these operations need not be performed in the order of presentation.

The phrase "in one embodiment" is used repeatedly. The phrase generally does not refer to the same embodiment. However, it may. The terms "comprising", "having" and "including" are synonymous, unless the context dictates otherwise.

As will be described in more detail below, in various embodiments, the recessed area in a pick and place cover allows for ventilation openings to be placed close to the center of a socket during reflow. For reflow in a forced air convection oven, the position and/or cross sectional area of holes through the pick and place cover may be key factors in improving air flow into the socket.

A flat surface in the center of the pick and place cap may be helpful for vacuum cup suction to pick and place during surface mount technology assembly. However, this means the holes through the cover will not be in the center of the pick and place cover, and the holes will be over the LGA socket contact field. Further, large vertical holes through the pick and place cover may create the risk of foreign material falling into the LGA socket contact area. This adds risk to the contact electrical performance either through contamination of the LGA socket contacts or damage of LGA socket contacts.

However, in various embodiments, by adding a recessed area to the pick and place cover, and using the sidewall related to this recessed area, the ventilation holes may be horizontal or diagonal, thus reducing the risk of foreign material falling into the LGA socket contact field. Moreover, the ventilation holes may also be close to the center of the socket.

Additionally, the recessed area of the pick and place cover will not allow for a package to be assembled in the LGA socket with the pick and place cover attached to the socket. The recessed area will interfere with the top of the package and the pick and place cover will pop off if a package is in the LGA socket.

FIG. 1 shows an exploded view of a portion of a socket arrangement, including a socket and an embodiment of a socket cover 100a (pick and place cover). As illustrated, for the embodiment, socket cover 100a includes a first portion 110 disposed on a first plane. Further, the first portion 110 includes a hollowed center 120 (recessed area). There is a second portion 130 disposed on a second plane that is spaced apart from the first portion, inside hollowed center 120. For this embodiment, the first portion 110 and the second portion 130 are joined by four sidewalls 140. As shown in this embodiment, the sidewalls 140 each have an opening 150 defined by edges.

Figure 2:
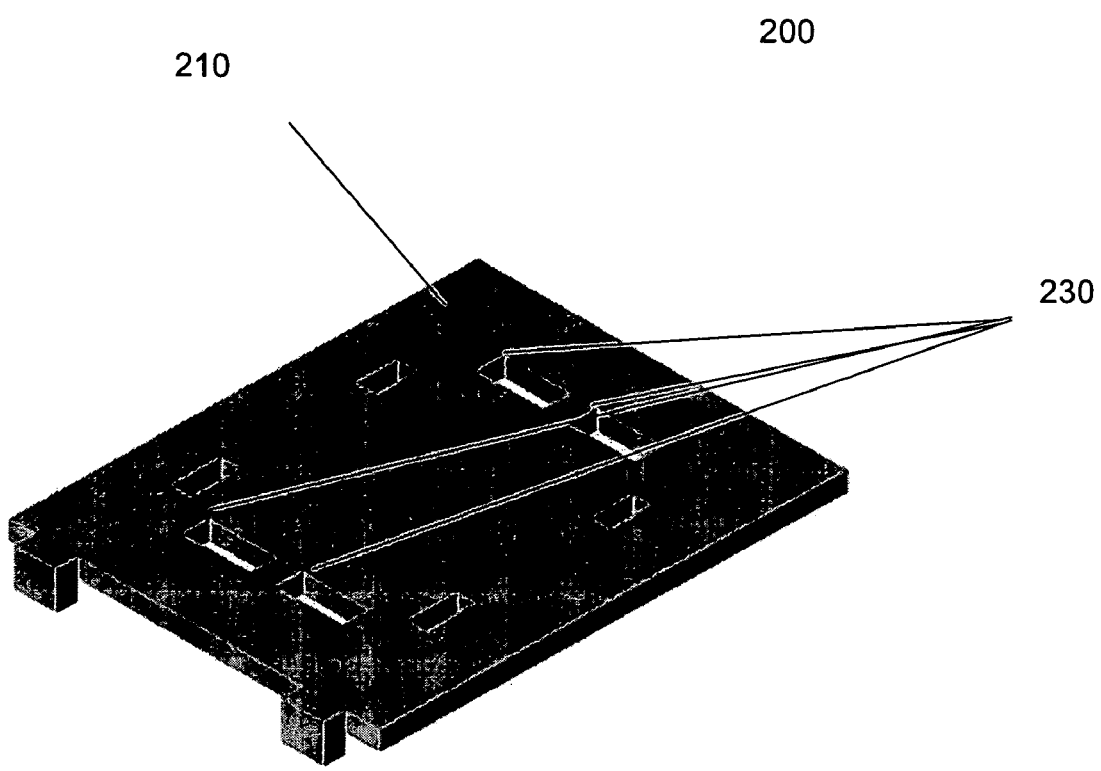
FIG. 2 illustrates a perspective view of a socket cover of the prior art.

As will be described in more detail below, socket cover 100a with one or more openings 150 located in the hollowed center 120, allows for air flow to be near the center of socket 100b. Resultantly, a reflow process applied to socket 100b in a forced air convection oven may be improved by the reduction in temperature gradient between the outer edges of socket 100b and the center of socket 100b. Further, the one or more openings 150 disposed on the one or more sidewalls 140 may reduce risk of contamination or damage to the socket contacts, especially when contrasted with socket covers 200 that have openings 230 distributedly disposed on a first plane 210 as shown in FIG. 2. Additionally, the hollowed center 120 would interfere with a die or package (not shown) previously installed in the socket 100b. This interference will prevent installation/attachment of socket cover 100a with a socket 100b having a die installed thereon already, thereby reducing potential damage to the die and socket 100b.

For ease of understanding, portion 110 and portion 130 are illustrated as generally parallelepiped for the embodiment shown in FIG. 1. For other embodiments, the first portion 110 and the second portion 130 need not be generally parallelepiped. In an embodiment, the first plane and the second plane are substantially parallel to each other. However, there is no requirement in other embodiments that the first plane and the second plane be substantially parallel. Additionally, while FIG. 1 shows an embodiment with a substantial rectangular hollowed center 120 with four (4) sidewalls 140, for other embodiments, the hollowed center 120 may assume other geometric shapes with more or less sidewalls 140. Further, not all sidewalls 140 have to have openings defined by edges. In the illustrated embodiment, the one or more sidewalls 140 are substantially orthogonal to the first plane and the second plane as depicted in FIG. 5A. In other embodiments, the sidewalls 140 may be angled inwardly and downwardly from the first plane towards the second plane as depicted in FIG. 5B. Yet in another embodiment, the one or more sidewalls may angle outwardly and downwardly from the first plane towards the second plane as depicted in FIG. 5C. In various embodiments, the second portion 130 is sufficiently smooth for a suction pickup (not shown). The suction pickup may be provided by a Pick and Place machine (not shown).

In various embodiments, socket cover 100a has one or more alignment tabs 160 that extend away from the first portion towards the second portion. The first portion 110 of the socket cover 100a comprises a first side and a second side, the second side faces the second plane, and the second side has a contour substantially conforming to a contour of a surface of the thermal mass 165. Further, in another embodiment, the thermal mass 165 has a hollowed center 170, and the second portion 130 and the one or more sidewalls 140 substantially conform to the complementary thermal mass' hollowed center 170. For ease of understanding, a restatement of the previous sentence would be that the hollowed (recessed) portion 120 of the socket cover 100a fits inside of the hollowed center 170 of the thermal mass. In some embodiments, the thermal mass is a surface mount Land Grid Array.

Figure 3:
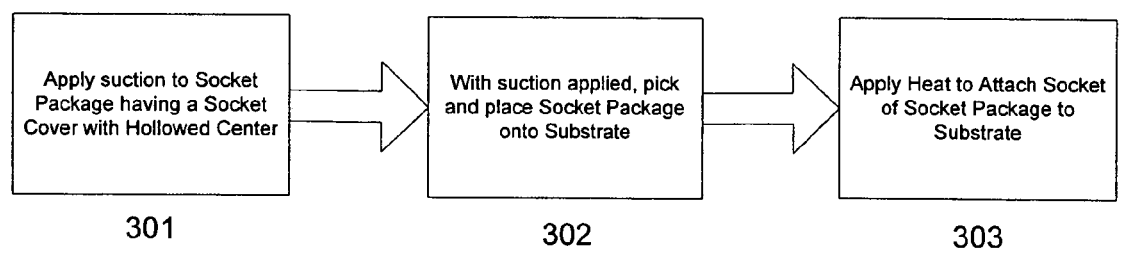
FIG. 3 illustrates a method for using the socket cover of FIG. 1, in accordance with one embodiment.

FIG. 3 illustrates an embodiment of a method of using socket cover 100a as represented in various embodiments for FIG. 1. For the embodiment, suction is first applied to a socket package 301. With the suction applied, the socket package is picked and placed onto a substrate 302. The socket package comprises the socket cover 100a removably engaged with the surface of the socket 100b as described earlier. In one embodiment, the suction is applied to the second portion 130 of the socket cover 100a through the hollowed center 120.

Next, in one embodiment, a heat source is applied to the socket package and the substrate in a reflow process that couples the socket 100b to a substrate while the socket cover 100a remains removably engaged to the socket 100b 303. The heat, in the form of a convection airflow, migrates/flows over the socket 100b through the openings defined by the edges in the socket cover 100a. In various embodiments, the substrate comprises a printed circuit board. In other embodiments, the socket comprises a surface mount Land grid Array socket.

Figure 4:
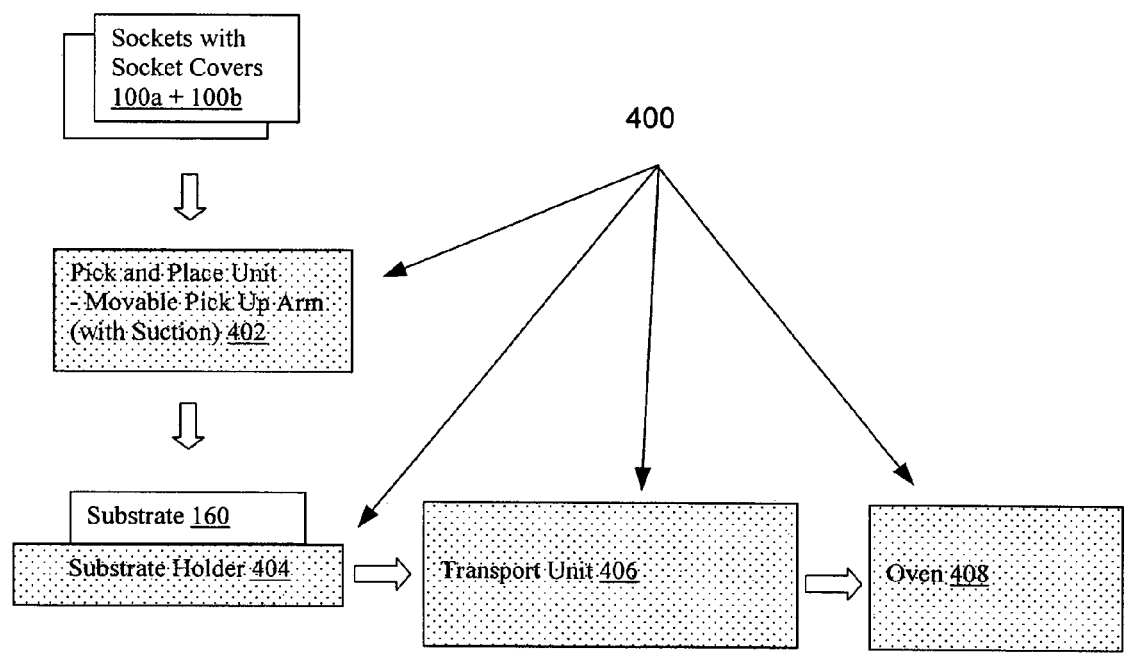
FIG. 4 illustrates a system adapted to use the socket cover of FIG. 1 in accordance with one embodiment.

FIG. 4 illustrates a block diagram view of a system adapted to use the socket cover of FIG. 1, in accordance with one embodiment. As illustrated, for the embodiment, the system 400 includes pick and place unit 402, holder 404, transport unit 406, and oven 408, operatively coupled to each other. For the embodiment, pick and place unit 402 includes in particular a movable pick and place arm adapted to apply suction to pick and place an object, more specifically, a socket package with the socket cover of FIG. 1.

Holder 404 is employed to hold a substrate 160. Pick and place unit 402, as described earlier, is employed to pick and place a socket package (having the socket cover of FIG. 1) onto the substrate 160. More specifically, the pick and place arm of pick and place unit 402 applies a suction to the socket package to pick up the package, while it moves to place the socket package onto substrate 160. As described earlier, the suction is applied to the recessed center of socket cover 100a.

The transport unit 406 is employed to move substrate 180 into oven 408 with the socket package placed thereon, i.e. the socket remains removably mated with the underside of the socket cover.

Oven 408 is then employed to apply heat to the combination (i.e. the socket package and the substrate) to attach the socket to the substrate 180, while the socket cover remains removably mated to the socket. As described earlier, the openings of the recessed center of the socket cover facilitates improved airflow for applying heat to the combination.

Except for the pick and place unit 402 adapted to pick and place the novel socket of FIG. 1, elements of system 400, i.e. pick and place unit 402, holder 404, transport system 406, and oven 408, all represent a broad range of these elements known in the art.

Thus, it can be seen from the above descriptions, embodiments for a novel socket cover for a socket, method for using such a socket cover, and a system adapted to use such a socket cover have been described. While the present invention has been described in terms of the foregoing embodiments, those skilled in the art will recognize that embodiments of the present invention are not limited to the embodiments described. Embodiments of the present invention can be practiced with modification and alteration within the spirit and scope of the appended claims.

Therefore, the description is to be regarded as illustrative instead of restrictive on the present invention.

What is claimed is:

1. A socket cover for a socket package, said cover comprising:
   a first portion having a first plane, and having a hollowed center;
   a second portion disposed inside the hollowed center, and having a second plane substantially parallel with the first plane and spaced apart from the first plane; and
   plurality of sidewalls, the sidewalls having at least one opening defined between inner edges, and the sidewalls joining the first portion and the second portion, wherein said second portion having a first side facing towards the first plane and a second side opposite of the first side, the second portion comprises at least a piece extending across the hollowed center to prevent attachment of the socket cover to the socket package when a die or a package is located against the second side of the second portion.

2. The socket cover of claim 1, wherein at least one of the one or more sidewalls occupies a plane substantially orthogonal to a selected one of the first plane and the second plane.

3. The socket cover of claim 1, wherein at least one of the one or more side walls occupies a plane that is angled inwardly and downwardly from the first plane towards the second plane.

4. The socket cover of claim 1, wherein at least one of the one or more side walls occupies a plane that is angled outwardly and downwardly from the first plane towards the second plane.

5. The socket cover of claim 1, wherein the first side of the second portion is sufficiently smooth for a suction pickup.

6. The socket cover of claim 1, wherein the first portion is generally parallelepiped.

7. The socket cover of claim 1, wherein the second portion is generally parallelepiped.

8. The socket cover of claim 1, further comprising one or more alignment tabs extending from said first portion towards said second plan.

9. The socket cover of claim 1, wherein at least one opening extends from a sidewall onto the second portion.

10. The socket cover of claim 1, wherein a thermal mass of a socket to be coupled to the socket cover has a hollowed center defined by edges, and the second portion and the one or more sidewalls substantially conform to the complementary thermal mass' hollowed center.

11. The socket cover of claim 10, wherein said complementary thermal mass comprises a surface mount Land Grid Array socket.

\* \* \* \* \*

UNITED STATES PATENT AND TRADEMARK OFFICE
CERTIFICATE OF CORRECTION

PATENT NO. : 7,014,488 B2
APPLICATION NO. : 10/901703
DATED : March 21, 2006
INVENTOR(S) : Brent S. Stone It is certified that error appears in the above-identified patent and that said Letters Patent is hereby corrected as shown below:

Figure 4
Reference number "160" should be reference number --180--

Column 3
Line 8, "...portion 110 and portion 130..." should read --...first portion 110 and second portion 130...--.
Line 47, "...portion 120..." should read --...center 120...--.

Column 4
Lines 13, 16, and 19, "...substrate 160..." should read --...substrate 180...--.
Line 35, "...transport system 406..." should read --...transport unit 406...--.

Signed and Sealed this

Twenty-fourth Day of April, 2007

JON W. DUDAS
*Director of the United States Patent and Trademark Office*